United States Patent [19]

Nguyen

[11] Patent Number: 5,638,011
[45] Date of Patent: Jun. 10, 1997

[54] DIGITAL TO ANALOG CONVERTER (DAC) CURRENT SOURCE ARRANGEMENT

[75] Inventor: Chinh D. Nguyen, San Jose, Calif.

[73] Assignee: I.C. Works, Inc., San Jose, Calif.

[21] Appl. No.: 694,958

[22] Filed: Aug. 8, 1996

Related U.S. Application Data

[63] Continuation of Ser. No. 226,772, Apr. 12, 1994, abandoned.

[51] Int. Cl.$^6$ .................................................. H03K 3/00
[52] U.S. Cl. ............................................. 327/108; 327/404
[58] Field of Search ................................. 327/103, 108, 327/368, 382, 384, 379, 170, 535, 537, 403, 404; 326/21, 23, 27

[56] References Cited

U.S. PATENT DOCUMENTS

| | | | |
|---|---|---|---|
| 4,831,282 | 5/1989 | Colles | 307/443 |
| 5,001,484 | 3/1991 | Weiss | 341/153 |
| 5,012,178 | 4/1991 | Weiss et al. | 323/269 |
| 5,148,065 | 9/1992 | Krenik et al. | 307/572 |
| 5,155,384 | 10/1992 | Duetz | 327/537 |
| 5,198,782 | 3/1993 | Scott | 330/277 |
| 5,239,210 | 8/1993 | Scott | 307/355 |

Primary Examiner—Timothy P. Callahan
Assistant Examiner—Jung Ho Kim
Attorney, Agent, or Firm—Oblon, Spivak, McClelland, Maier & Neustadt, P.C.

[57] ABSTRACT

Arrangement for providing improved current source signals in a DAC current source circuit including a current source transistor, an output transistor, and a switching transistor for selectively grounding the source current or directing it through the output transistor. The DAC current source circuit includes a high gain double cascode device for electrically isolating the current source and output transistors from the switching transistor. The isolation device may include one, two or more transistors in series. The arrangement further includes a matching circuit at the input of the DAC current source circuit.

3 Claims, 6 Drawing Sheets

5,638,011

DIGITAL TO ANALOG CONVERTER (DAC) CURRENT SOURCE ARRANGEMENT

This application is a Continuation of application Ser. No. 08/226,772, filed on Apr. 12, 1994, now abandoned.

TECHNICAL FIELD

The present invention relates to current source arrangements for digital to analog converters (DACs), and more specifically to current source arrangements for high frequency DACs.

BACKGROUND OF THE INVENTION

FIG. 1a shows a standard prior art DAC current source circuit 10 effective for active to non-active mode switching in the range of 100 Megahertz. The prior art DAC current source circuit 10 includes first, second, and third p-channel CMOS transistors, respectively transistors 12, 14, and 16. For convenience, transistors 12, 14, and 16 are additionally referred to as respective transistors Q1, Q2, and Q3. These three transistors are connected to a central node 20. More particularly, transistor 12 (i.e., Q1) is connected to Vcc, the DC voltage source, and to node 20, while driven at its gate by a COMP signal. Transistor 14 (i.e., Q2) is connected between node 20 and ground, receiving the input signal at its gate. Finally, transistor 16 (i.e., Q3) is connected between node 20 and an output connection 24, while being driven at its gate by a reference signal, Vref.

DAC current source circuit 10 in FIG. 1a is unfortunately hampered by a long output settling time. This is caused by the gate to source capacitance of transistor 14 (i.e., Q2), as emphasized by the parasitic capacitance illustration in FIG. 2. The gate to source capacitance of transistor 14 is represented by a parasitic capacitor 32 including capacitor C2 and leads connecting capacitor C2 to the gate and source of transistor 14.

Further, the DAC current source circuit 10 is subject to undesired current spiking at output connection 24, i.e., OUTPUT, when the INPUT connection to transistor 14 is switched. This current spiking effect is caused by the gate to source capacitance of transistor 14, which is represented by a parasitic capacitor circuit 32 including capacitor C2 and leads for connecting capacitor C1 to the drain and source of transistor 14. As can be seen in FIG. 2, transistor 14 is connected to node 20 of DAC current source circuit 10. When the input signal at the gate of transistor Q2 switches, the parasitic capacitance represented by parasitic capacitor C2 will cause the voltage level at node 20 to rise rapidly. This rise in voltage level is accompanied by significant and undesired current spiking at the output connection 24 during transition times.

With input signal switching at the gate of transistor 14 in DAC current source circuit 10 in FIGS. 1a and 2, the voltage at node 20 is subject to considerable change accompanied by undesired current spiking, as noted above. The effect of the voltage change at node 20 will be applied through the parasitic capacitances represented by parasitic capacitors C1 and C3. This in turn will affect the bias voltages COMP and Vref. With these bias voltages changing, the DAC current source will not provide the desired constant current source at transition times. Moreover, at higher speeds (i.e., frequencies), increased noise levels and current spiking are not unlikely.

FIG. 1b shows the circuitry of FIG. 1a further including a driver circuit 23, according to the prior art, for producing the input COMP signal for DAC current source circuit 10. Driver circuit 23 includes an operational amplifier or opamp 24' connected to the gate of a transistor 25 comparable to transistor 12 in basic characteristics of DC and steady state operation. Opamp 24' has plus and minus inputs, the minus input being connected to input Vref and the plus input being connected to node 26. This connection scheme ensures that opamp output signal COMP will be negative when Vref changes in a positive direction and negative when Vref changes in a positive direction. During steady state, the output of opamp 24', i.e., COMP, will be steady, because Rset, the voltage value at node 26, will follow the value of Vref.

Transistor 25 is typically a p-channel field effect transistor connected at its source to Vcc. Driver circuit 23 further includes a resistor 27 connected to a node 26 at the drain of transistor 25. The resistance of resistor 27 is effective for determining the amount of electric current flowing between the source and drain connections of transistor 25 and through resistor 27 itself. As the characteristics of transistors 25 and 12 are the same and the resistance of resistor 27 and the conducting one of transistors 14 and 16 are the same, the conductive current Ic through resistor 27 will be the same as the conductive current Ic passing through the conducting one of transistors 14 and 16.

According to one implementation of the prior art circuitry shown in FIGS. 1a, 1b, and 2, is shown in the diagrams of FIGS. 5b and 5d which show output waveforms for a DAC current source circuit according to the prior art producing non-ideal pulses having considerable undesired ringing effects which are particularly pronounced immediately after a transition between low and high pulse amplitude values or between high and low pulse amplitude values.

It is further well-known according to the prior art, that DAC current sources can be interconnected to form a digital to analog converter 29 as shown in FIG. 1c. The digital to analog converter or DAC 29 in this case includes a plurality of current source circuits 10 each having an input and an output connection. The DAC 29 shown is effective for converting a portion of a byte of digital bits into an analog equivalent current. The complete digital byte includes respective bits A7–A0, beginning with the most significant bit (MSB) and ending with the least significant bit (LSB). The lowest significant bit A0 is applied to the input of a single DAC current source 10a. The next significant bit A1 is applied to the respective inputs of first and second DAC current sources, respectively 10b(1) and 10b(2). This scheme continues until the most significant bit input is applied to the respective inputs of first through one hundred twenty-eighth DAC current sources, respectively 10h(1) through 10h(128). The analog output node 24 of the digital to analog converter 29 is connected to each of DAC current sources 10a(1), 10b(1), 10b(2), 10c(1) ... 10c(4), 10d(1) ... 10d(8), 10e(1) ... 10e(16), 10f(1) ... 10f(32), 10g(1) ... 10g(64), 10h(1) ... and 10h(128). According to this arrangement of the prior art, if the value of a particular input bit is one, the first current amount provided by a first one of DAC current sources is enhanced by any DAC current sources following after the first current source. For example, if the most significant bit A7 is 1, the initial current amount produced by DAC current source 10h(1) is multiplied by a factor of two to the seventh power (i.e., 128) by the contributions of the succeeding DAC current sources 10h(1) through 10h(128).

It is accordingly an object of the invention to develop a high frequency current source for digital to analog conversion applications, which is not subject to the inadequacies, limitations, and problems of the prior art.

It is an object of the invention to enable fast and smooth current source switching for DAC applications effective for high speed switching from digital to analog states.

Additionally, it is an object of the invention to develop an integrated circuit, CMOS current source applicable to digital to analog conversion circuit designs.

SUMMARY OF THE INVENTION

In particular, according to the invention herein, there is provided a CMOS digital to analog converter (DAC) current source circuit capable of switching in the 200 Megahertz range. The DAC current source circuit of the invention includes a current source transistor connected between Vcc and a current switching node. The DAC current source circuit according to the invention further includes a switching transistor and an output transistor, both of which are connected to the current switching node. The DAC current source circuit further has the essential feature of the invention of isolating the current switching node, the output transistor, and the current source transistor from the switching transistor. This isolation feature prevents voltage effects based upon parasitic capacitance from impacting the voltage at the electric node between the indicated circuit elements including the output transistor, the current source transistor, and the switching transistor.

According to a version of the invention, the input driver circuit for the DAC current source circuit includes a transistor network having a ladder of matching transistors which substantially mirror the transistors of the DAC current source circuit including the current source transistor, the bias transistor(s), and the switching transistor. In one case, in which the DAC current source circuit includes a single isolating bias transistor, the matching transistors of the ladder of matching transistors include first and second p-channel transistors to match the p-channel current source transistor of the DAC current source circuit. The matching transistors according to the first case additionally include first and second n-channel transistors to match the n-channel bias transistor of the DAC current source circuit effective for providing isolation according to the invention herein. Finally, in this first case, the matching transistors include another set of first and second n-channel transistors to match the n-channel switching transistor of the DAC current source circuit. The indicated sets of matching transistors are interconnected at their respective gates, such that the gates of the respective first and second p-channel transistors are connected to each other and to Vcc. Similarly, the gates of the respective first and second n-channel transistors matching the switching transistor of the DAC current source are connected to each other and to Vcc as well. Further, the gates of the respective first and second n-channel transistors matching the bias transistors of the DAC current source which are effective for isolating its current switching transistor from the central electric node are connected to each other, and in the first case to one of the drain connections of the p-channel transistors matching transistor network. In a second case, in which there are two bias transistors in series to provide isolation between the central electric node and the switching transistor of the DAC current source node, there will be two sets of first and second matching transistors connected at their respective gates to accomplish the matching with the two bias transistors of the DAC current source node. The gates of the first and second matching transistors of each of these two sets will be connected to each other, and further to the drain of one of the first and second matching transistors of the particular gate connected set. The numbers of sets of first and second matching transistors corresponds to the number of bias transistors employed in series for isolation of the switching transistor from the central electric node. As noted already, the number of such bias transistors can be one or two, but any number of bias transistors which are employed for the purposes of this invention, can be employed.

According to one version of the invention, the electrical isolation of the central electric node of the DAC current source circuit is accomplished specifically to isolate the switching transistor from the central electric node. The isolation according to one version includes separating the central electric node from the switching transistor with first and second isolation transistors. According to another version of the invention, a single isolation transistor could be employed to accomplish isolation. In either case, the kind of transistor employed as the switching transistor is an n-channel device.

Accordingly, with the circuitry of the invention, the advantages of greater noise immunity, high impedance, high gain, and fast switching are obtained. These and other features and advantages of the present invention will become apparent upon reading the following detailed descriptions and studying the various figures of the drawings.

DETAILED DESCRIPTION OF THE PREFERRED EMBODIMENTS

Figure 1A:
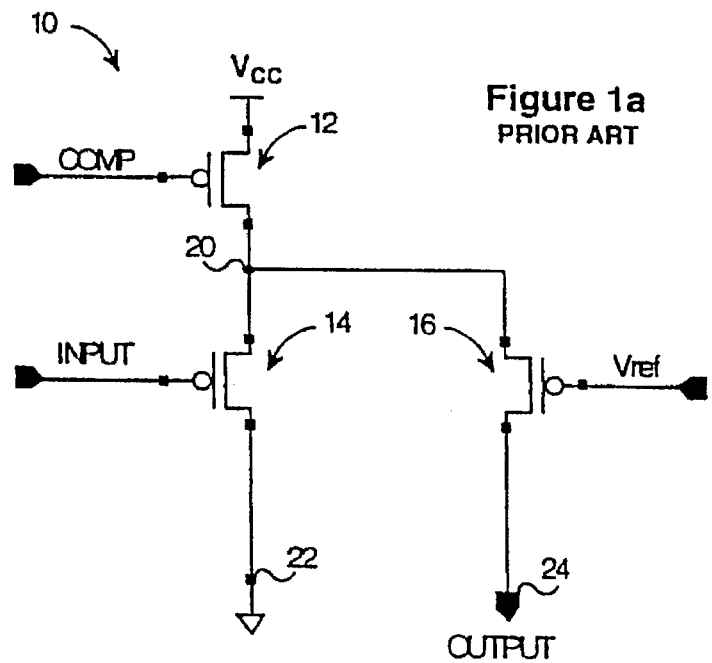
FIG. 1a shows a standard prior art DAC current source circuit effective for active to non-active mode switching in the range of 100 Megahertz.
Figure 1B:
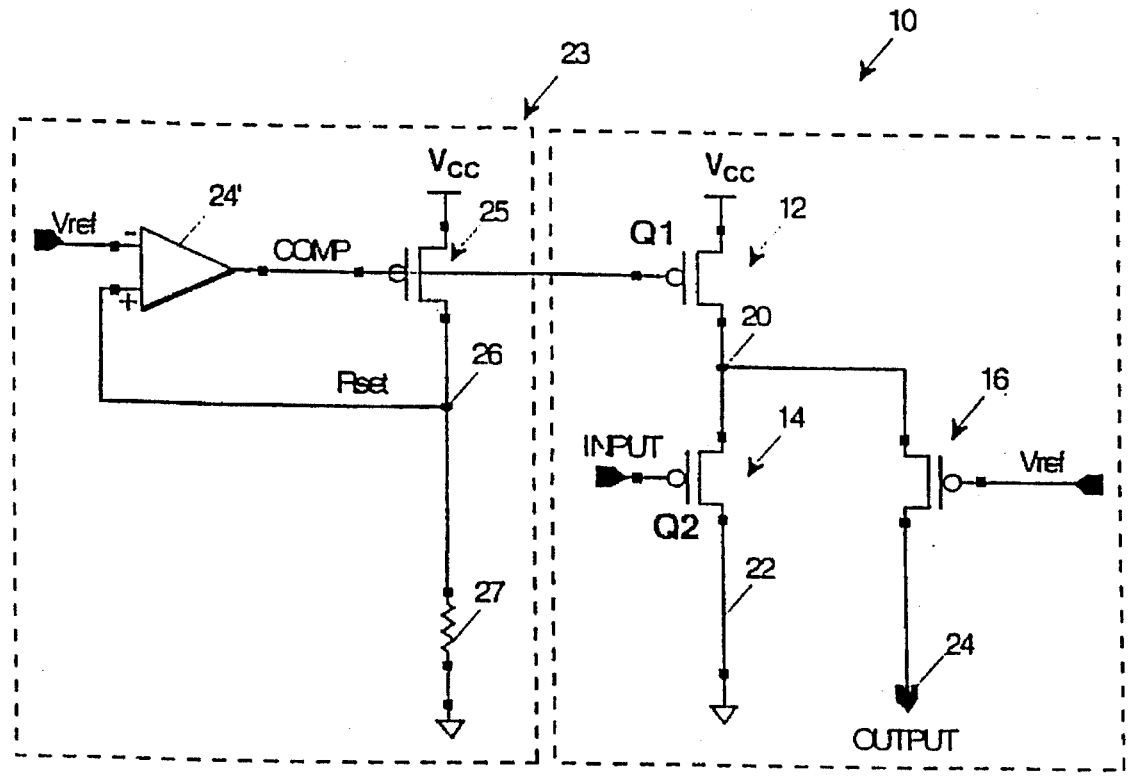
FIG. 1b shows the standard prior art DAC current source circuit according to FIG. 1a further including a driver circuit according to the prior art which includes an operational amplifier for producing a COMP signal for input into the gate of the current source transistor of the DAC current source.
Figure 1C:
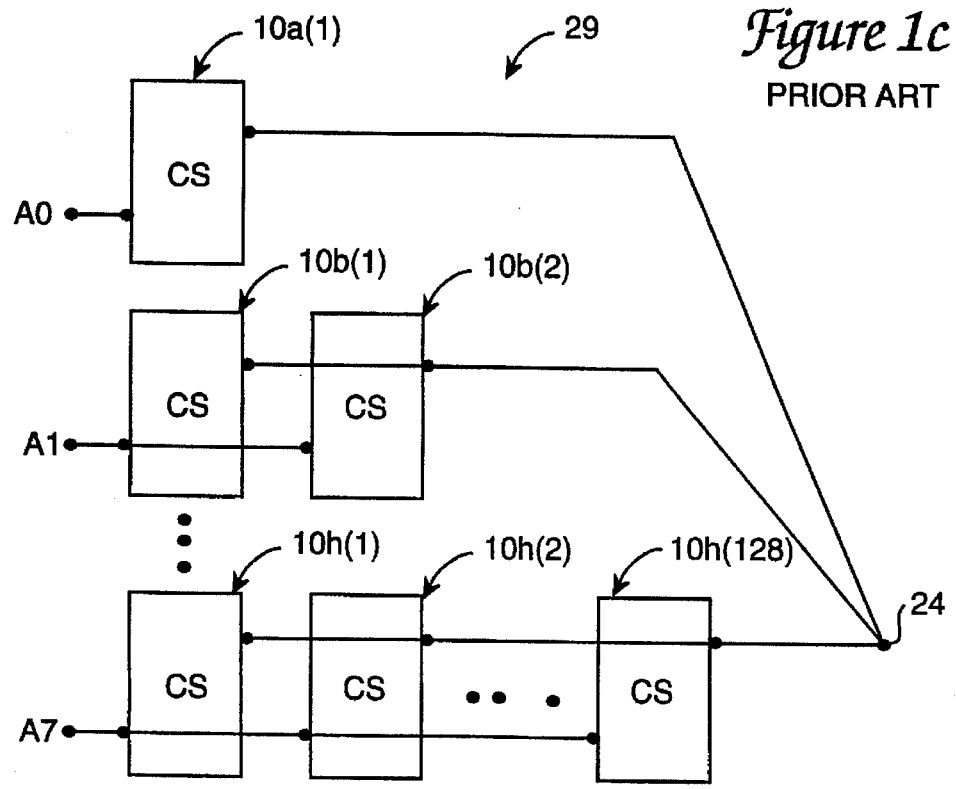
FIG. 1c shows a prior art approach to interconnecting DAC current sources to form a single byte digital to analog converter.
Figure 2:
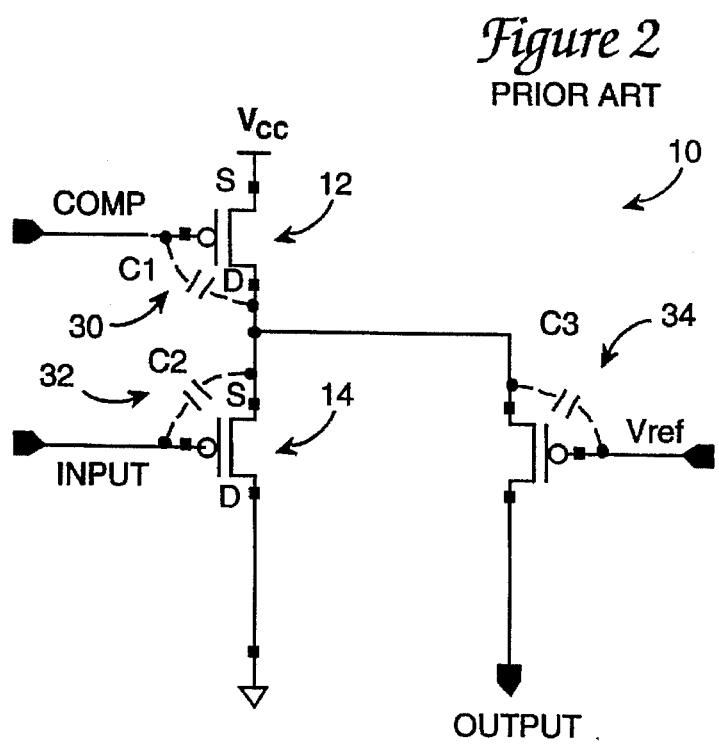
FIG. 2 shows a standard prior art DAC current source circuit effective for active to non-active mode switching in the range of 100 Megahertz according to FIG. 1a, which further shows the parasitic capacitances applying to the transistors comprising the DAC current source.
Figure 3:
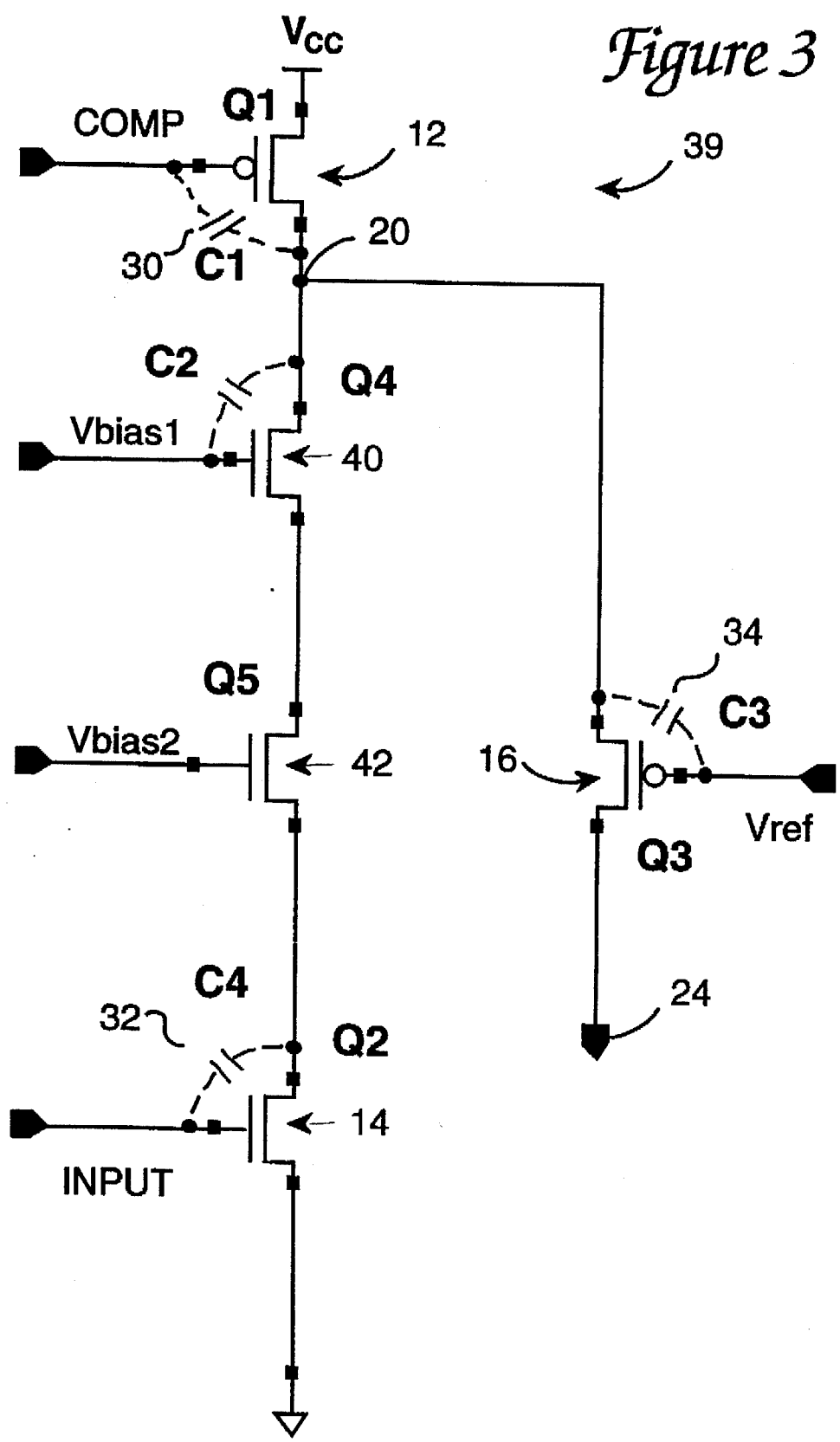
FIG. 3 shows the 200 MHz DAC current source circuit according to the invention herein, including isolation features to be discussed below.

FIG. 3 shows a 200 MHz DAC current source circuit according to the invention herein, including isolation features to be discussed below. In particular, FIG. 3 shows a DAC current source circuit 39 effective for active to non-active mode switching in the range of 200 Megahertz. The DAC current source circuit 39 includes first, second, third, fourth and fifth transistors, respectively transistors 12, 14, 16, 40, and 42. For convenience, transistors 12, 14, and 16 are additionally referred to as respective transistors Q1, Q2, and Q3. Transistors Q4 and Q5 are respectively referred to as transistors 40 and 42. Transistors 12, 16, and 40 are connected to central node 20. More particularly, transistor 12 (i.e., Q1) is connected to Vcc, the DC voltage source, and to node 20, while driven at its gate by a COMP signal. Transistor 14 (i.e., Q2) is connected between transistor 42 and ground, receiving the input signal at its gate. Transistor 16 (i.e., Q3) is connected between node 20 and an output connection 24, while being driven at its gate by a reference signal, Vref. Transistors 40 and 42 are connected in series to each other and between central circuit node 20 and transistor 14. Transistors 40 and 42 are respectively driven at their gates by respective signals Vbias1 and Vbias2. The respective parasitic capacitances affecting respective transistors 12, 14, and 16 are shown respectively as capacitances C1, C2, and C3, and respectively as the capacitances of capacitors 30, 32, and 34. Notably, under this version of the invention, switching transistor 14 is isolated from central circuit node 20 by transistors 40 and 42.

Figure 4:
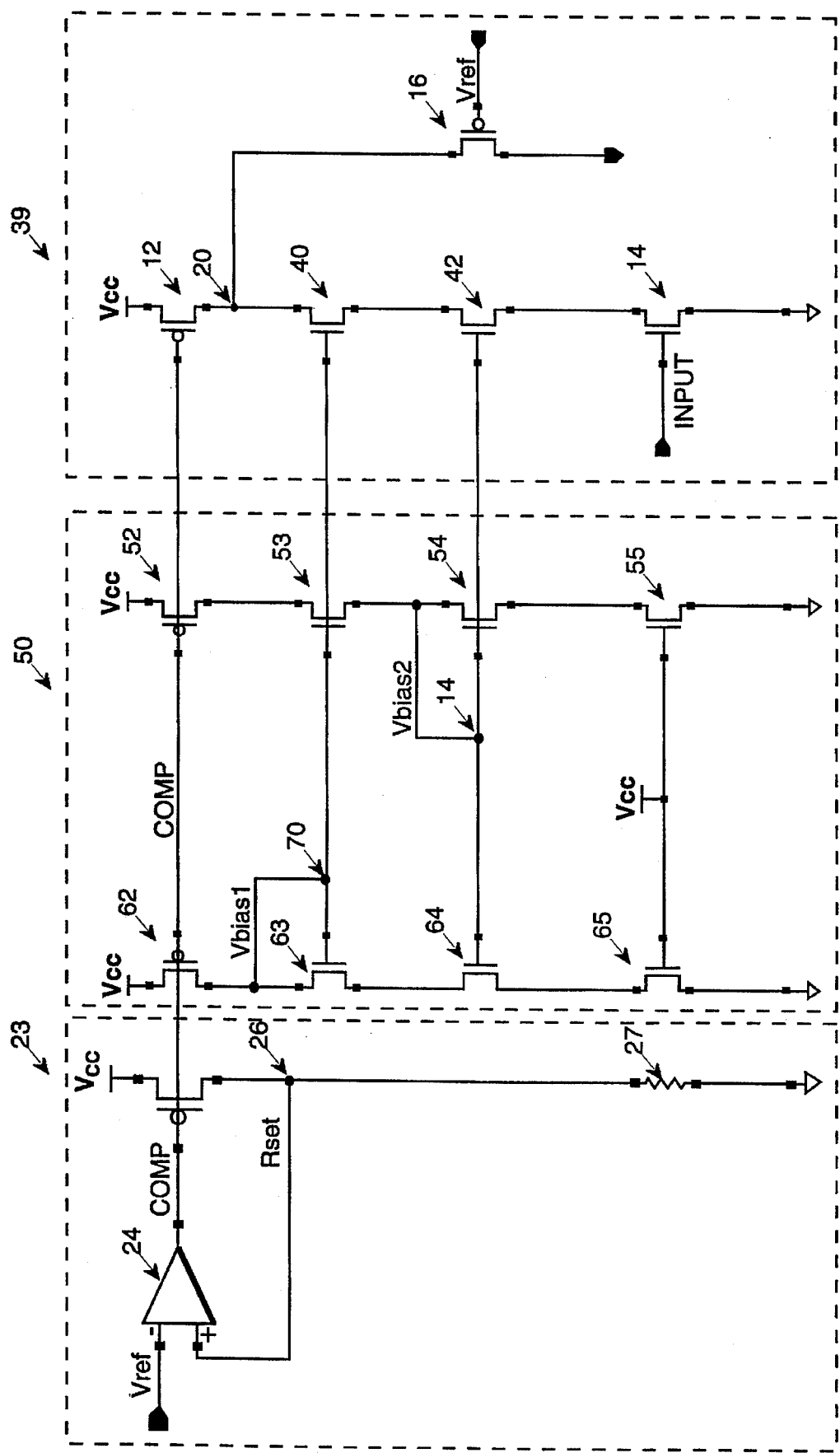
FIG. 4 shows the DAC current source circuit of FIG. 3 further including a ladder network of matching transistors effective for smoothing the operation of the DAC current source circuit.

FIG. 4 shows the DAC current source circuit 39 of FIG. 3 further including a double cascade network of matching transistors effective for smoothing the operation of the DAC current source circuit 39. Further according to a version of the invention, there is connected to DAC current source circuit 39 both an input driver circuit 23 and an intermediate matching circuit 50 including a transistor network having a double cascode of matching transistors 52–55 and 62–65 which substantially mirror the transistors of DAC current source circuit 10. The intermediate matching circuit 50 includes first and second p-channel transistors 52 and 62 effectively to match the characteristics of current source transistor 12 of DAC current source circuit 39. Intermediate matching circuit 50 further includes two sets of first and second n-channel transistors, respectively 53 and 63 and 54 and 64 to match respective n-channel bias transistors 40 and 42 of DAC current source circuit 39 effective for providing isolation according to the invention herein. Finally, intermediate matching circuit 50 includes n-channel matching transistors 55, 65 to match n-channel switching transistor 14 of DAC current source circuit 39. The indicated sets of matching transistors 52 and 62, 53 and 63, 54 and 64, and 55 and 65 are interconnected at their respective gates. For example, the gates of respective first and second n-channel transistors 55 and 65 are connected to each other and to Vcc. Similarly, the gates of the respective first and second p-channel transistors 52 and 62 matching the current source transistor 12 of the DAC current source 39 are connected to each other. Further, the gates of each set of respective first and second n-channel transistors 53 and 63, and 54 and 64, matching the respective bias transistors 40 and 42 respectively of DAC current source 39 which are effective for isolating its current switching transistor 14 from the central electric node 20, are connected to each other.

The numbers of sets of first and second matching transistors 53 and 63, and 54 and 64 corresponds to the number of bias transistors 40, 42 employed in series to accomplish high gain, enhanced switching speed, and isolation of the switching transistor 14 from central electric node 20. As noted already, the number of such bias transistors can be one or two or more. According to a version of the invention, the gates of transistors 53 and 63 are further connected to the drains of transistors 62 and 63. Further, according to the same version of the invention, the gates of transistors 54 and 64 are connected to the source of transistor 53 and to the drain of transistor 54. Other variations can be made. For example, the gates of transistors 53 and 63 could alternatively be connected to the drains of transistors 52 and 53. Further, the gates of transistors 54 and 64 could be connected to the source of transistor 63 and the drain of transistor 64.

Figure 5A:
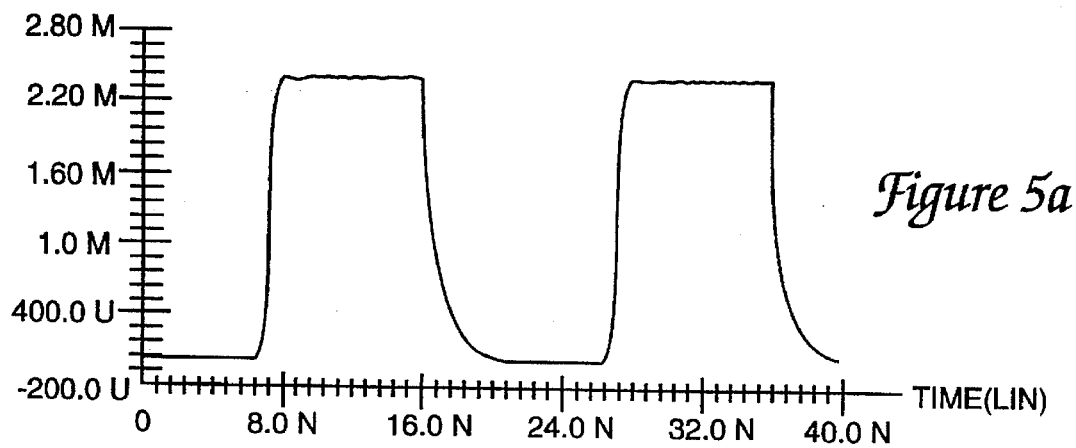
FIG. 5a shows an output waveform which can be produced by a DAC current source circuit according to a version of the invention herein operating at 100 MHz.
Figure 5B:
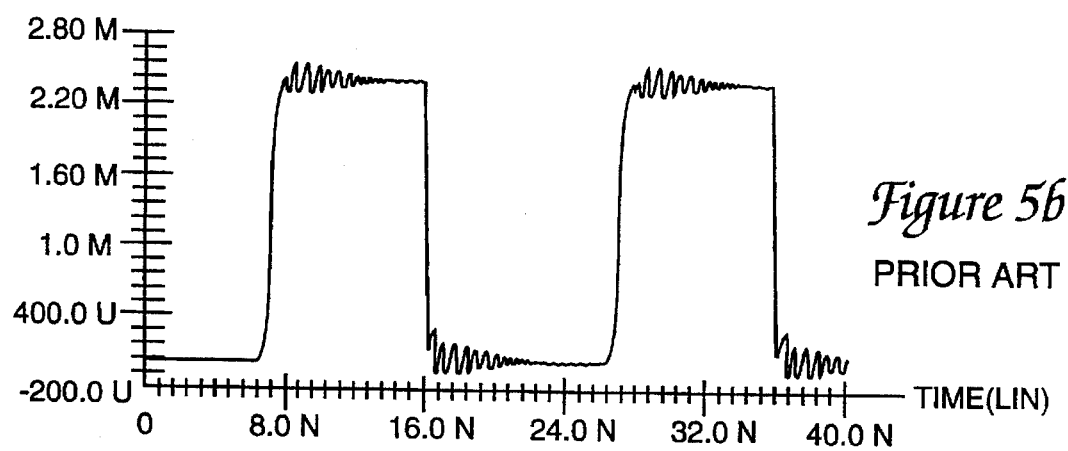
FIG. 5b shows an output waveform which can be produced by a DAC current source circuit according to a version of the prior art operating at 100 MHz.
Figure 5C:
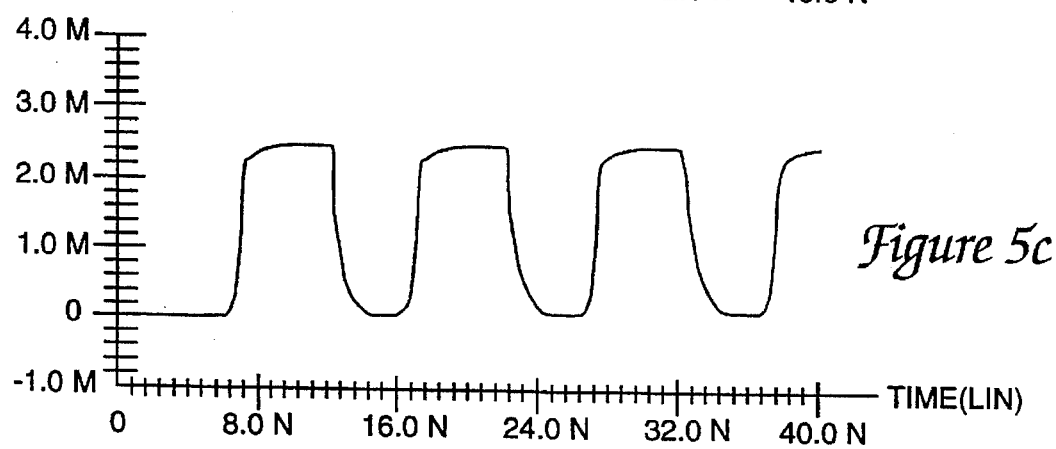
FIG. 5c shows an output waveform which can be produced by a DAC current source circuit according to a version of the invention herein operating at 200 MHz.
Figure 5D:
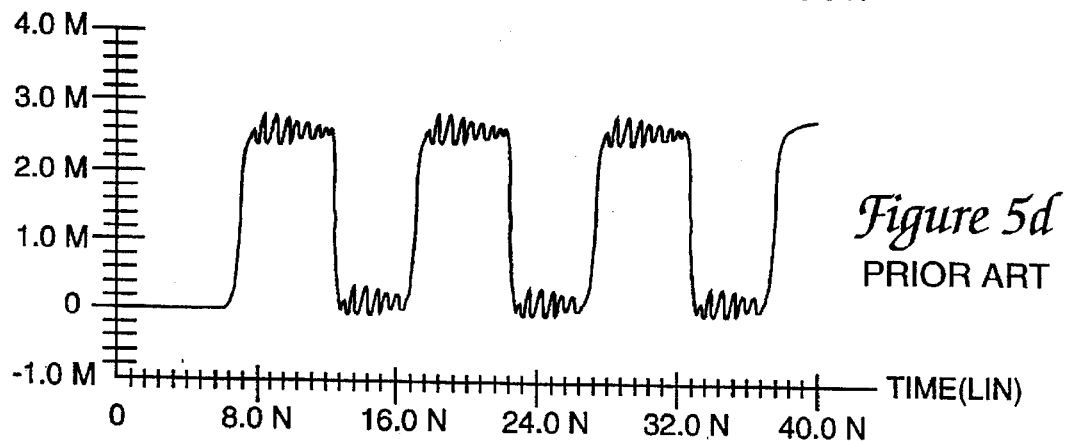
FIG. 5d shows an output waveform which can be produced by a DAC current source circuit according to a version of the prior art operating at 200 MHz.

FIG. 5a shows an output waveform which can be produced by a DAC current source circuit 39 according to a version of the invention herein operating at 100 MHz. The waveform is notably clean and free of ringing effects. FIG. 5b shows an output waveform which can be produced by a DAC current source circuit according to a version of the prior art operating at 100 MHz. This waveform trace shows major ringing effects, particularly at the beginning of each pulse waveform. FIG. 5c shows an output waveform which can be produced by a DAC current source circuit 39 according to a version of the invention herein when operating at 200 MHz. Although some irregularities are visible in the waveform, these are relatively minor. On the other hand, as seen in FIG. 5d, the output waveform which can be produced by a DAC current source circuit according to a version of the prior art operating at 200 MHz may be characterized by substantial and undesired current effects.

Figure 6:
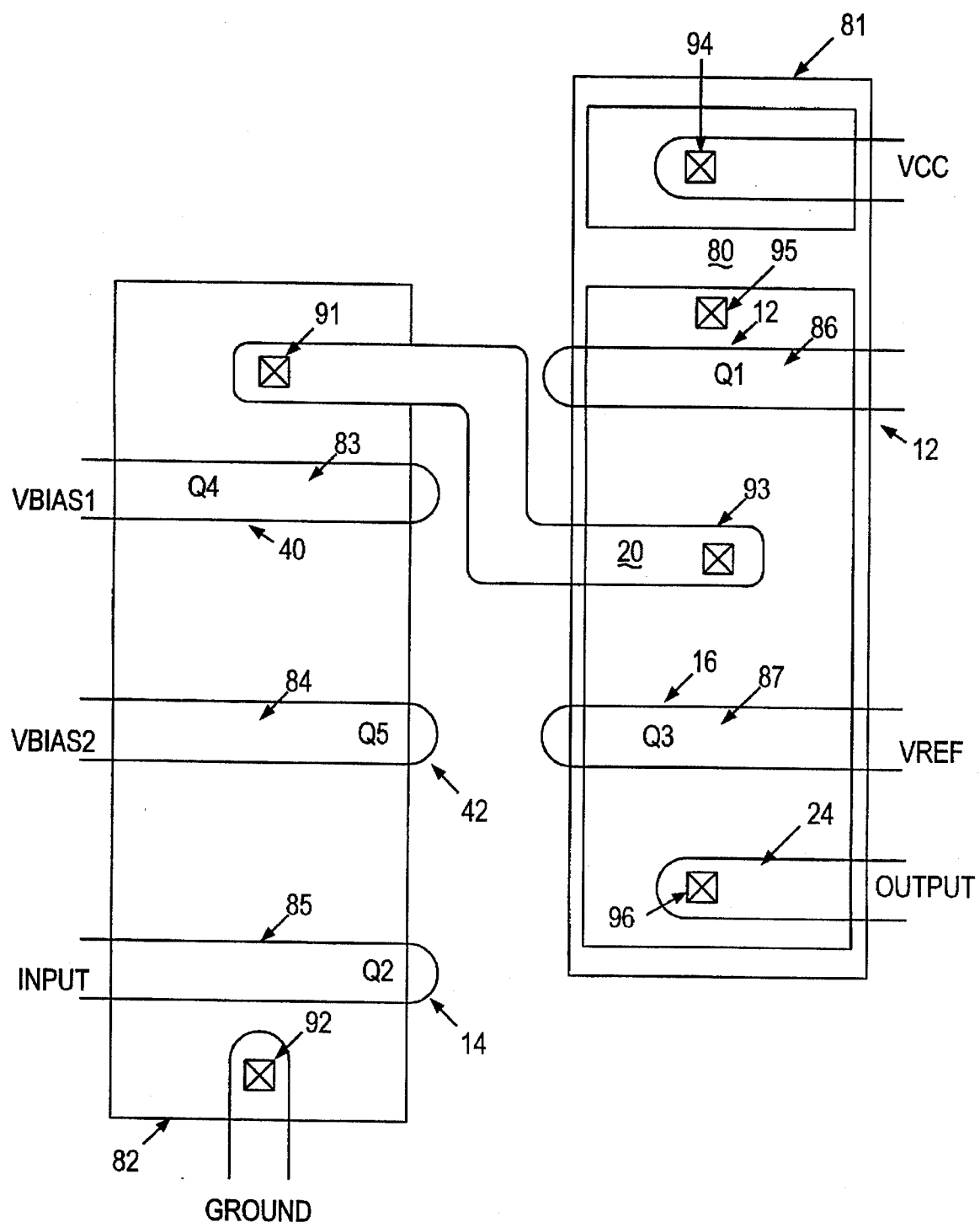
FIG. 6 shows the topography of the five transistors of a version of the invention herein, based respectively upon CMOS processing techniques.

FIG. 6 shows the topography of the five transistors 12, 14, 16, 40, and 42 of a version of the invention herein, based respectively upon CMOS processing techniques. Transistors 12 and 16 are p-mos transistors, and transistors 14, 40, and 42 are n-mos transistors. In particular, the respective transistors 12, 14, 16, 40, and 42 are fabricated on a semiconductor substrate 80 which is provided with first and second diffusion regions 81 and 82, respectively defining zones of p+ and n+ diffusion. Transistors 12 and 16 are fabricated in the p+ diffusion region; and transistors 14, 40, and 42 are fabricated in the n+ diffusion region. The respective fabrication processes are well known and include the deposition of appropriate oxide layers followed by poly layer leads effective for permitting the application of voltage signals to the respective gates of the transistors under fabrication. In particular, FIG. 6 shows poly layer leads 83–87 respectively connected to the gates of respective transistors 40, 42, 14, 12, and 16. The fabrication of the indicated transistors further includes fabricating contacts 91–96 for making electric connections by aluminum leads or traces for example. One such electrical connection can be established between contacts 91 and 93, to establish central connecting node 20 fabricated out of a metal layer such as aluminum, for example, at the drain of transistor 12 and the source of transistor 16. Contact 92 provides a connection between the source of transistor 14 (Q2) and ground or common along a suitable metalic conductive layer Contacts 94 and 95 provide a connection to Vcc, and contact 96 is connected electrically to conductive metal output connection 24.

While this invention has been described in terms of several preferred embodiments, it is contemplated that many alterations, permutations, and equivalents will be apparent to those skilled in the art. It is therefore intended that the following appended claims be interpreted as including all such alterations, permutations, and equivalents as fall within the true spirit and scope of the present invention.

What is claimed is:

1. A DAC current source current comprising:

a current source transistor including a source, a drain, and a gate, for providing a predetermined current, an output circuit branch for receiving a current from said current source means, a switch circuit configured to permit selective diversion of a current from said current source transistor and from said output circuit branch, said switch circuit including a switching sub-circuit and a multistage isolation circuit, said multistage isolation circuit having a control input and a plurality of isolation stages and being effective for substantially eliminating the capacitance between said current source transistor and said switching sub-circuit, said multistage isolation circuit including a bias input for each isolation stage; and a matching circuit for matching said current source transistor and said switch circuit, said matching circuit including first, second and third series connected subcircuits, each of said first and second series connected subcircuits including a first matching output and a plurality of second matching outputs corresponding to respective ones of said isolation stages, wherein the first, the plurality of second matching outputs are connected respectively to the gate of said current source transistor, and the respective bias inputs of said respective isolation stages.

2. A DAC current source circuit according to claim 1, wherein said isolation circuit includes first and second series connected field effect transistors, said first series connected field effect transistor being connected between said current source transistor, and said second series connected field effect transistor being connected between said first series connected field effect transistor and said switching sub-circuit.

3. A DAC current source circuit according to claim 1, wherein said isolation circuit includes first and second transistors each having a gate, a drain and a source, said first and second transistors being connected in series, said respective gates of said first and second transistors being connected to corresponding ones of said plurality of second matching outputs.

* * * * *